United States Patent
Berg (10) Patent No.: US 8,368,467 B2
(45) Date of Patent: Feb. 5, 2013

(54) CASCODE AMPLIFIER WITH INCREASED LINEARITY

(75) Inventor: Håkan Berg, Harestad (SE)

(73) Assignee: SAAB AB, Linköping (SE)

( * ) Notice: Subject to any disclaimer, the term of this patent is extended or adjusted under 35 U.S.C. 154(b) by 0 days.

(21) Appl. No.: 13/125,919

(22) PCT Filed: Oct. 24, 2008

(86) PCT No.: PCT/EP2008/064463
§ 371 (c)(1),
(2), (4) Date: Jun. 29, 2011

(87) PCT Pub. No.: WO2010/045984
PCT Pub. Date: Apr. 29, 2010

(65) Prior Publication Data
US 2011/0248780 A1 Oct. 13, 2011

(51) Int. Cl.
*H03F 3/45* (2006.01)
(52) U.S. Cl. ........................ 330/252; 330/253
(58) Field of Classification Search ............ 330/252, 330/253
See application file for complete search history.

(56) References Cited

U.S. PATENT DOCUMENTS

| | | | |
|---|---|---|---|
| 6,229,376 B1 | 5/2001 | Geysen | |
| 6,313,667 B1 * | 11/2001 | Eschauzier | 330/261 |
| 6,956,435 B2 * | 10/2005 | Banba | 330/252 |
| 2007/0008038 A1 | 1/2007 | Klepser et al. | |
| 2008/0001672 A1 | 1/2008 | Shih et al. | |

FOREIGN PATENT DOCUMENTS

JP 61020407 1/1986

OTHER PUBLICATIONS

PCT/ISA/210—International Search Report—Dec. 2, 2009.

* cited by examiner

*Primary Examiner* — Khanh V Nguyen
(74) *Attorney, Agent, or Firm* — Venable LLP; Eric J. Franklin (57) ABSTRACT

An amplifier circuit for current amplification. An input stage is adapted to receive an input signal. At least one current multiplication stage is connected to the input stage. The current multiplication stage is adapted to receive a current signal from the input stage and to produce a multiplied output current signal at an output of the amplifier circuit. The current multiplication stage includes at least two current multiplication circuits connected to each other. Each current multiplication circuit is adapted to produce an output current signal essentially equal to the current signal from the input stage, such that the output current signal at an output of the amplifier circuit includes a sum of the current signals received at each current multiplication circuit. A method of improving linearity in an amplification circuit.

16 Claims, 9 Drawing Sheets

CASCODE AMPLIFIER WITH INCREASED LINEARITY

CROSS-REFERENCE TO RELATED APPLICATIONS

This application is the national phase under 35 U.S.C. §371 of PCT/EP2008/064463 filed 24 Oct. 2008.

TECHNICAL FIELD

The present invention is related to amplifier circuits. More specifically it is related to linearity in amplifier circuits.

BACKGROUND ART

In today's radar systems there is a requirement of higher and higher linearity at more or less constant current consumption for an amplifier circuit.

If two signals are supplied to the two inputs of the amplifier, then the linearity of the amplifier may be defined as the ability of the amplifier to curb intermodulation products at the amplifier output per given signal power.

The difference between a useful signal and undesired intermodulation products can be written as $IM_3=2(IP_3-I_{signal})$ (expressed in dB). In this case $IP_3$ is related to every tone, but it may also be related to the sum of powers on each tone, i.e. $I_{signal}+3$ or the vector sum of the tones, i.e. $I_{signal}+6$. IP3 is often given in dBm, but it may equally be put in relation to a current or a voltage. We will choose to relate $IP_3$ to a current, since it is the current amplitude which influences the amplitude of the intermodulation products.

Figure 1:
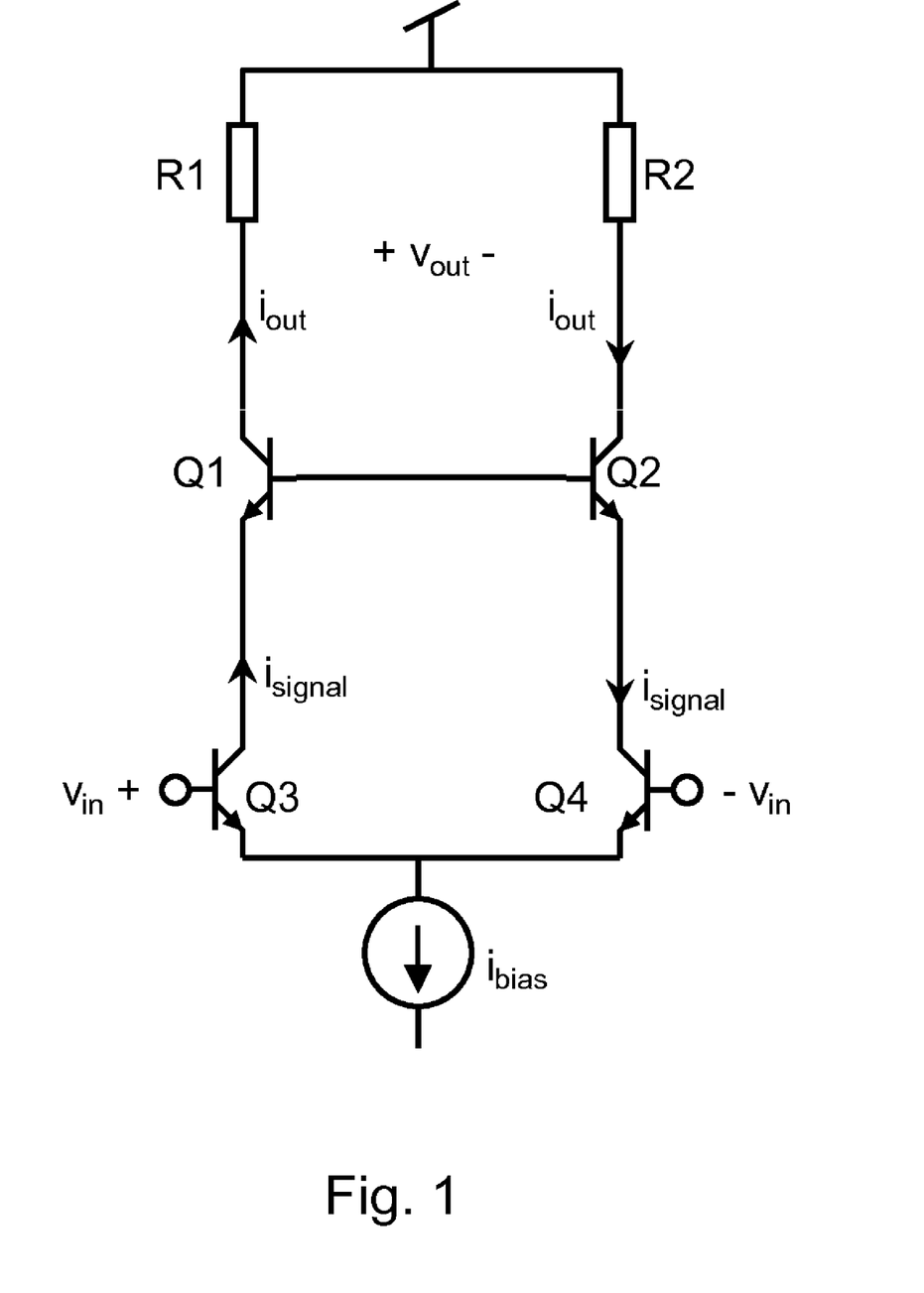
FIG. 1 illustrates a cascode amplifier according to known technology.

One common circuit for signal amplification is a cascode amplifier shown in FIG. 1.

The upper part of the circuit comprises a current follower with the transistors Q1 and Q2 whose function is to keep the output current $i_{out}$ at the same level even if its output is loaded by a high impedance which would lead to a high power consumption. Thus $i_{out}$ stays essentially the same even if R1 is increased.

The lower part of the circuit transforms an input voltage signal into an output signal current. Both stages use the same bias current $i_{bias}$ shown in the figure.

Figure 7:
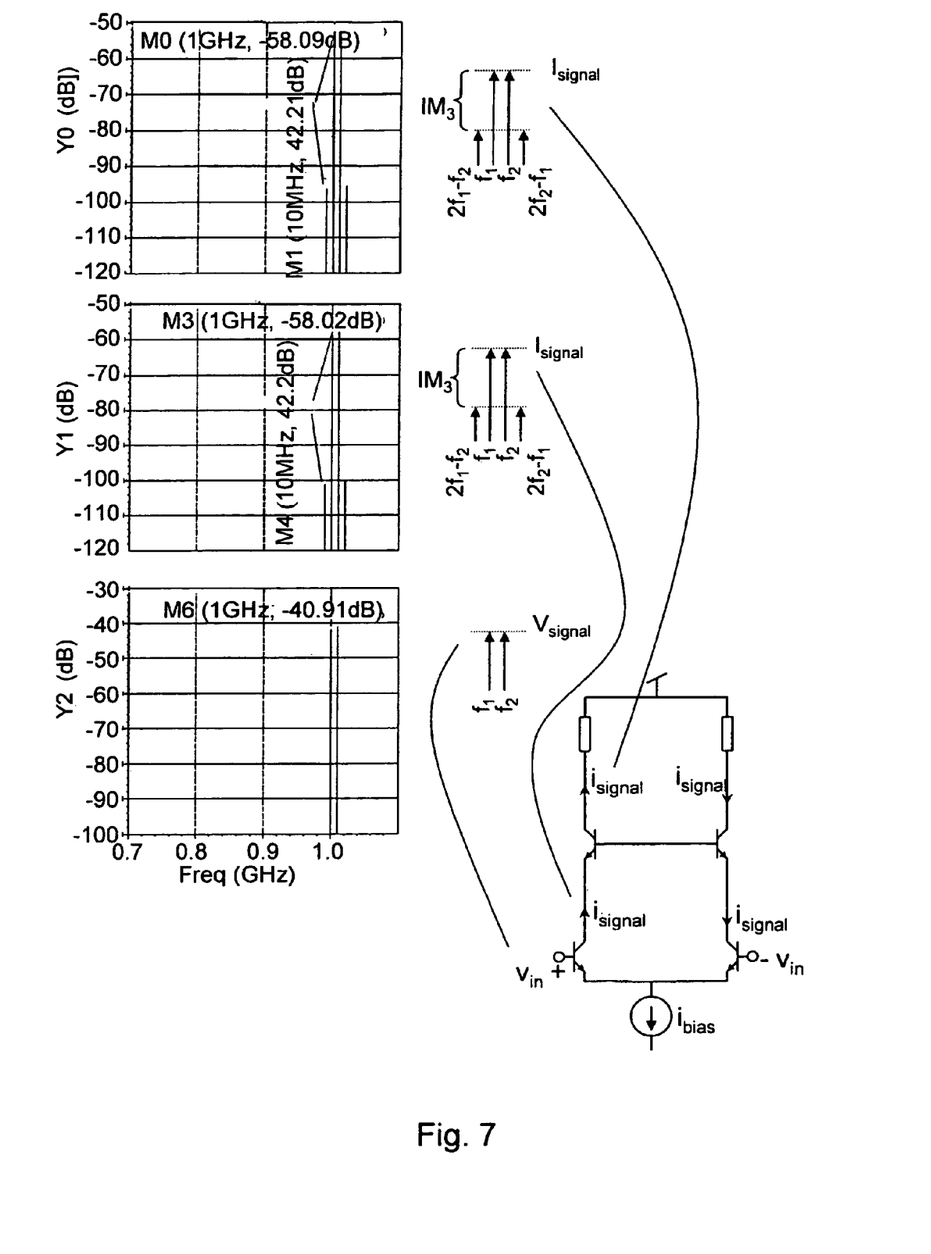
FIGS. 7-9 illustrate the amplification diagrams for intermodulation products in the circuits from FIGS. 1 and 3.

FIG. 7 shows the cascode amplifier together with the intermodulation products produced by the two stages of the amplifier. The diagrams to the left of the cascode amplifier display the signal amplitude expressed in dB as a function of frequency. By studying the diagrams in FIG. 7 it may be seen that the amplitude of the intermodulation products before and after the current follower stage remains the same. Hence the entire contribution to the increase of the amplitude for the intermodulation products comes from the transconductance stage of the cascode amplifier.

Examining the linearity of a cascode amplifier one notices that it is theoretically possible to decrease the bias current in the current follower and to increase the bias current through the transconductance stage comprising the transistors Q3 and Q4 without sacrificing linearity. However, this is difficult to do, since both stages share the same bias current $i_{bias}$. Moreover, if the current saving due to the bias current reduction in the current follower stage and the subsequent current increase through the cascode amplifier should be of any use, the increased current should be put to use. Otherwise power consumption is reduced in the current follower stage only to be wasted in the transconductance stage.

However, the problem with this solution is that the transconductance stage cannot handle as high a signal current as the current follower at a given bias current. The reason for that is that an increase of the signal current through the transconductance stage would increase the amplitude of the intermodulation products in the output signal from the transconductance stage.

One other alternative may be to increase the bias current $i_{bias}$ in the entire cascode amplifier, i.e. in both the transconductance stage and the current follower stage. This solution however, wastes current and therefore power in the current follower where no amplification of the signal is achieved.

One other alternative may be increase the linearity of the amplifier circuit by adapting the transconductance stage to deliver a lower signal current than the current follower. This, however, would necessitate replacing the current follower by a current amplifier. Traditionally, current amplifiers are built with a transconductance amplifier, which in this case would not lead to a satisfactory solution.

SUMMARY OF THE INVENTION

The present invention aims at solving at least some of the problems related to known technology.

One solution according to the present invention is related to an amplifier circuit for current amplification comprising: an input stage adapted to receive an input signal; at least one current multiplication stage connected to the input stage, where the current multiplication stage is adapted to receive a current signal from the input stage and produce a multiplied output current signal at an output of the amplifier circuit, wherein the current multiplication stage comprises at least two current multiplication circuits connected to each other, each current multiplication circuit adapted to produce an output current signal essentially equal to the current signal from the input stage, such that the output current signal at an output of the amplifier circuit comprises a sum of the current signals received at each current multiplication circuit.

The advantage of amplifier circuit according to the present invention with respect to known technology is increased linearity and current amplification at the same time. The additional current resulting from the amplification can be put to use elsewhere in an electric circuit where the amplifier circuit according to the present invention is used.

Another aspect of the present invention comprises a current multiplication circuit comprising a first and a second transistor having their gate terminals connected to each other where the first transistor is adapted to receive an input signal current at its emitter terminal and to output an output current essentially identical to the input signal current on the collector terminal of the first transistor and the emitter terminal of the second transistor, where the current multiplication circuit is adapted to fulfil a function of the current multiplication stage in the amplifier circuit according to the invention mentioned earlier.

Moreover, another aspect of the present invention is related to a method for increasing linearity in an amplifier circuit comprising the steps of receiving a signal at an input stage of an amplifier circuit; receiving a signal current from the input stage at a current amplification stage, producing essentially the same signal current at the outputs of at least two current amplification circuits of the current amplification stage, combining the signal currents at the outputs of the at least two current amplification circuits to produce a sum of the signal currents at the output of the amplifier circuit.

These and other advantages of the present invention will become more apparent after studying the above detailed description together with the accompanying drawings.

BRIEF DESCRIPTION OF THE DRAWINGS

FIGS. 8-9 are essentially the same with different signal levels.

DETAILED DESCRIPTION

Before describing the components which are included in the embodiments of the present invention described in the figures below it is assumed that all transistors operate in the active mode, i.e. they act as amplifiers. Moreover, it should be pointed out that while the example embodiments of the present invention use bipolar transistors, this should not be construed as limiting the invention to the use of bipolar transistors only. Analogous solutions using Field Effect Transistors (FETs) or other solid state components are equally possible. Also, while the solutions in FIGS. 3-6 utilize transistors in the form of discrete components, it should be pointed out that equivalent solutions using integrated components are equally possible.

Figure 2:
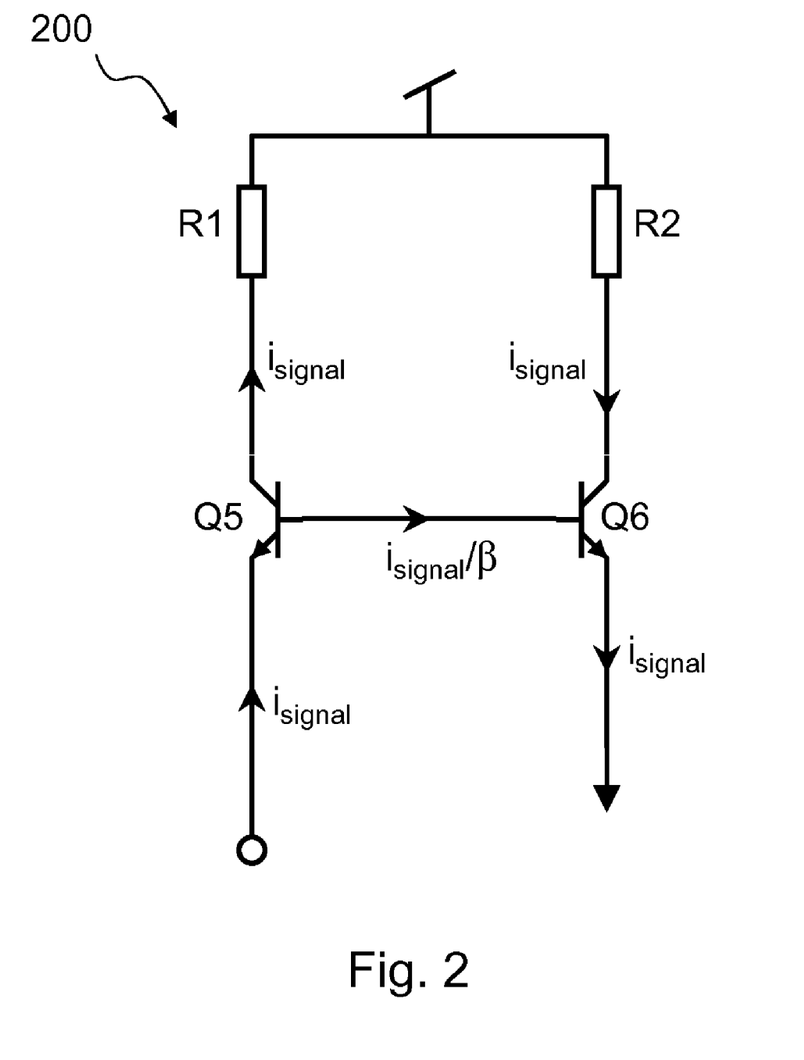
FIG. 2 illustrates a common-base amplifier used as an active balun, hereafter denoted common-base balun.

FIG. 2 illustrates a common-base balun 200 being a basic component included into the embodiments of the present invention in FIGS. 3-6. In this version of the common-base balun, two bipolar transistors Q5 and Q6 share a common base, where the Q5 transistor receives a signal current $i_{signal}$ on its emitter terminal. This input signal current $i_{signal}$ is reproduced as the output signal current at the collector terminal of the transistor Q5.

At the same time the current from the base terminal of transistor Q5 is used as the input current $i_{signal}/\beta$ to the transistor Q6. Transistor Q6 in turn produces the same output current $i_{signal}$ on its collector terminal. Note however, that output currents from Q5 and Q6 have different polarity. R1 and R2 are the load resistances driven by the output current $i_{signal}$. R1 and R2 may be either passive or active loads, the active loads for example being transistors.

The main advantage of the common-base balun circuit 200 is that it produces the same output signal current $i_{signal}$ on both of its output terminals from a single input signal current.

Figure 3:
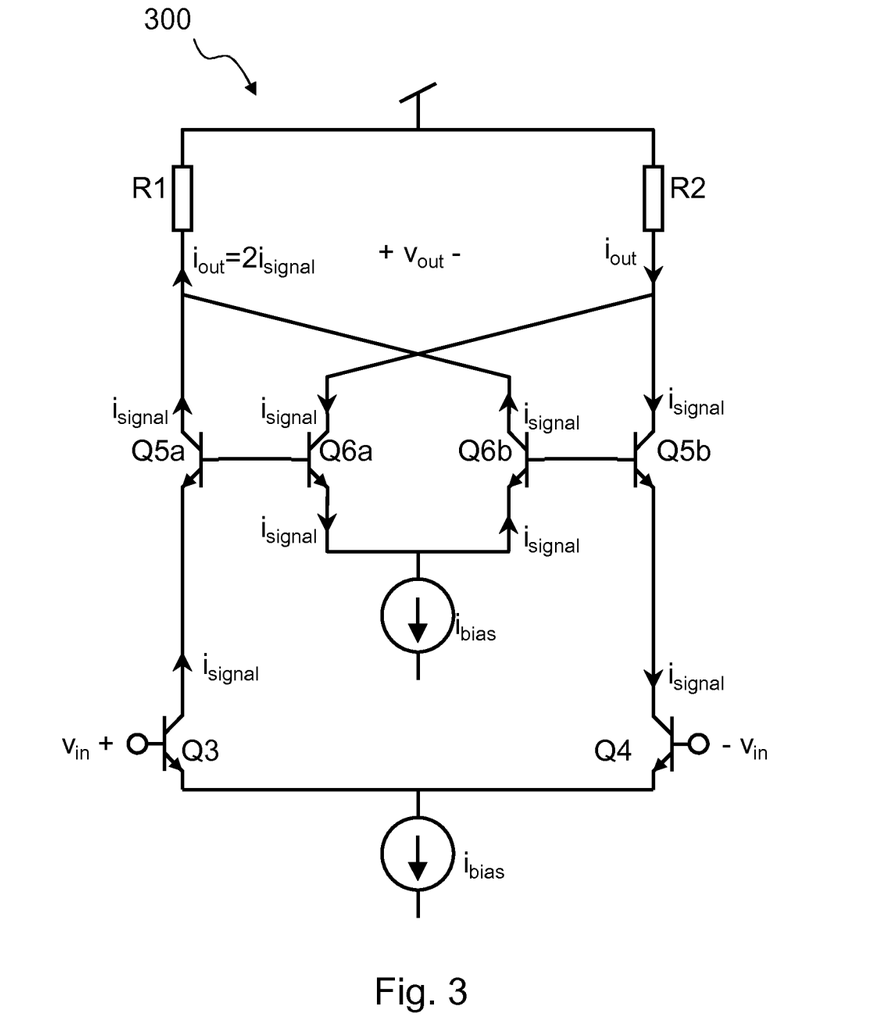
FIG. 3 illustrates a modified cascode amplifier circuit according to one embodiment of the present invention.

FIG. 3 illustrates an amplifier circuit 300 according to one embodiment of the present invention. In the embodiment in FIG. 3, the amplifier circuit 300 comprises a modified cascode amplifier, where the two cross-coupled common-base baluns from FIG. 2 have replaced the transistors Q1 and Q2 of the current follower. The signal current received at the emitter of Q5a is reproduced at the collector of Q6a with different polarity. The same way the signal current received at the emitter of Q5b is reproduced at the collector of Q6b with opposite polarity. When combining the currents of the collectors of Q5a with Q6b and Q5b with Q6a an effectively doubling of the signal current is achieved compared to the signal current out from the transconductance stage Q3 and Q4. This doubling can be done without increasing the intermodulation products signal levels relative the useful signals hence increasing linearity which will be explained more in detail in FIG. 8.

The output current $I_{out}$ current is supplied to the loads R1 and R2 which may be purely passive in the form of resistive, capacitive, inductive or other similar loads, or comprise active components, such as additional amplifier circuits or transistors.

Hence the advantage of the present invention is increased linearity of the amplifier circuit by an increase in the current through the amplifier circuit.

At the same time the bias current $i_{bias}$ from the two common-base balun can be used to bias other circuit components which may be connected to the amplifier circuit 300. One way of utilizing the extra bias current $i_{bias}$ from the two common-base baluns shown in FIG. 4.

It should be pointed out here that one may use more than two baluns from FIG. 2 connected in series to replace the current follower in order to achieve an even higher increase of the output current. This is illustrated more in detail in FIG. 5.

Figure 4:
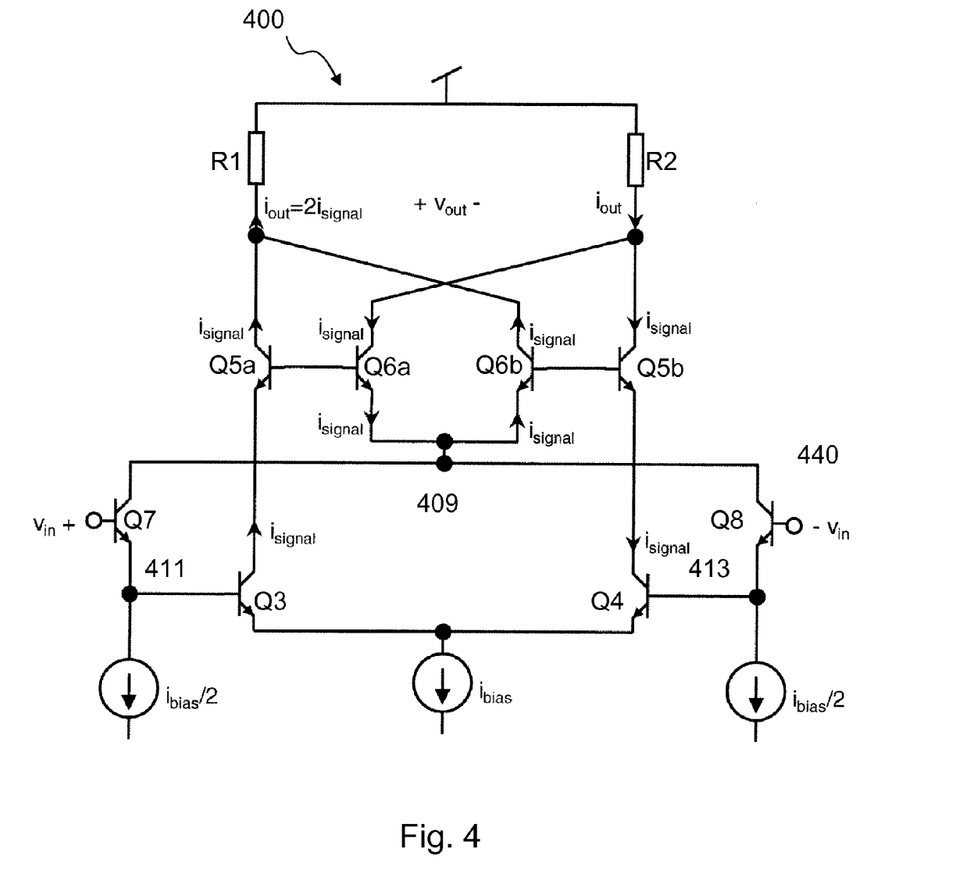
FIG. 4 illustrates the modified cascode amplifier circuit according to another embodiment of the present invention.

In FIG. 4 the amplifier circuit from FIG. 3 has been modified, so that transistors Q7 and Q8 have been connected to the modified cascode circuit, such that they form an emitter follower feeding the modified cascode amplifier. The input signal is now present in the circuit in the form of an input voltage Vin over the base terminals of transistors Q7 an Q8. At the same time, the extra bias current $i_{bias}$ from the two common-base baluns has been used to bias the transistors Q7 and Q8.

Figure 5:
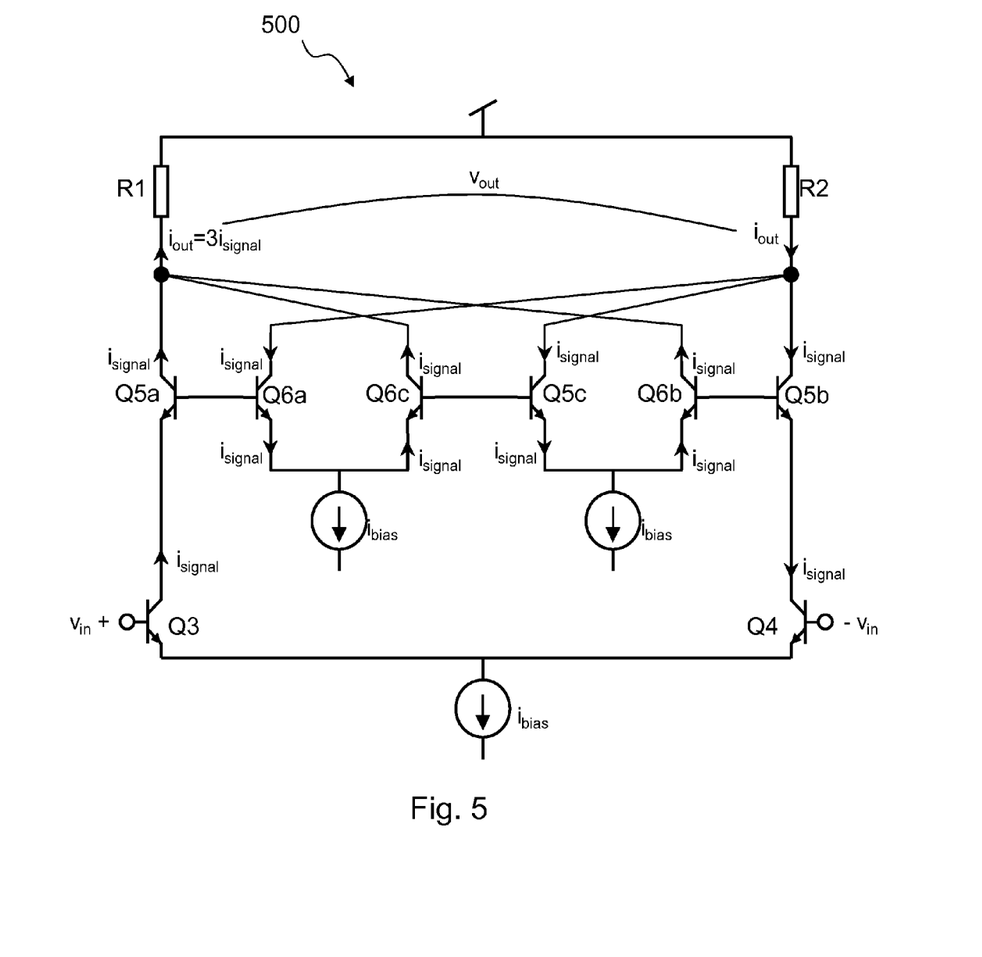
FIG. 5 illustrates the modified cascode amplifier circuit according to yet another embodiment of the present invention.

FIG. 5 illustrates an amplifier circuit 500 according to another embodiment of the present. The amplifier circuit is analogous to the amplifier circuit in FIG. 4 with the difference that the current multiplication stage of the amplifier circuit 500 now comprises a first, second and third balun are connected to each other.

It should be mentioned that the first, second and third baluns comprising the transistors Q5a, Q6a and Q5b, Q6b and Q5c, Q6c are essentially identical to the balun in FIG. 2.

The advantage of the amplifier circuit in FIG. 5 is that the amplifier circuit offers higher linearity by producing a triple output current $3*i_{signal}$ with constant IM3 from an input voltage signal Vin present over the base terminals of Q3 and Q4.

It may be mentioned here that theoretically up to N number of baluns may be connected to replacethe transistors Q1 and Q2 of the current follower. This may theoretically result in an output current $I_{out}$ N times that of that in circuit 300.

Figure 6:
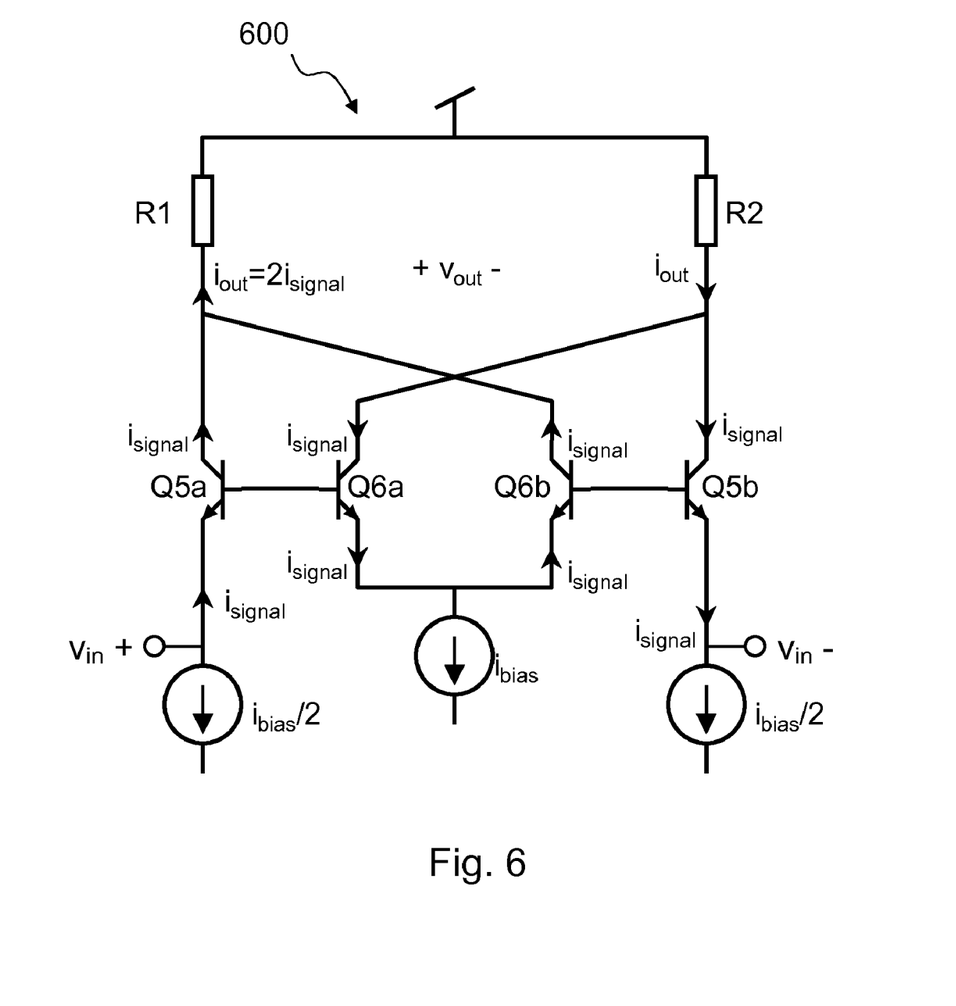
FIG. 6 illustrates a current amplification circuit according to yet another embodiment of the present invention.

FIG. 6 illustrates a pure current multiplier without the transconductance amplification stage according to another embodiment of the present invention. Here, the amplification circuit 600 only comprises a current multiplier with the transistors Q5a, Q6a, Q5b and Q6b. An input voltage Vin is present over the terminals depicted in FIG. 6 resulting in a input signal current $i_{signal}$ flowing into the emitter terminal of transistor Q5a. Comparing the circuits in FIG. 3 and FIG. 6 one notices that apart from the missing transconductance stage, the amplifier circuit 600 is analogous to the one in FIG. 3. Hence, the amplifier circuit 600 amplifies an input signal in the form of an input current $i_{signal}$ to double the input current $i_{signal}$, i.e. iout=$2*i_{signal}$. Since the functioning principle of the upper part of the circuit in FIG. 3 has been explained earlier and is identical to the circuit 600, its functioning principle will not be repeated here. The embodiment of the present invention in FIG. 6 merely serves to illustrate that the principle of current multiplication with increased linearity using two common-base baluns also holds in a circuit without a transcoductance amplifier.

Thus, it would also be possible to use more than two cross-coupled common-base baluns in the amplifier circuit 600 coupled into the amplifier circuit in the same fashion as in FIG. 5.

FIG. 7 illustrates the linearity of the cascode amplifier circuit from FIG. 1 by means of diagrams where the amplitude of two close tones and their related intermodulation products are displayed as a function of frequency. It should be mentioned that the y-axis of the diagrams displays signal amplification expressed in dB, while the x-axis displays the frequency in GHz.

As can be seen from the figure, the lowermost amplification diagram illustrates the signal level of an input voltage signal $V_{signal}$ which is present as the two frequencies $f_1$ and $f_2$ over the base terminals of transistors belonging to the transconductance stage of the cascode circuit in FIG. 1.

The original signal level at the two frequencies (which are around 1 GHz) in this example simulation was −40.91 dB.

After being converted into a current signal $i_{signal}$ and amplified, the current signal will comprise intermodulation products at the frequencies $2f_1$-$f_2$ and $2f_2$-$f_1$. As mentioned earlier, the ability of an amplifier circuit to suppress intermodulation products is a measure of its linearity.

We notice the amplitude of the signal current after the transconductance stage to be −58.02 dB. At the same time, the amplitude of the intermodulation products lies about 42 dB lower than the useful signals. From the middle diagram in FIG. 7 it can be seen that the signal level of the useful signal IM3 is 42.2 dB after the transconductance amplification stage.

After passing the current follower stage, the signal level of the useful current signal is essentially unchanged.

In conclusion it can be seen that the entire contribution to the intermodulation products in the cascode circuit comes from the transconductance amplification stage.

Figure 8:
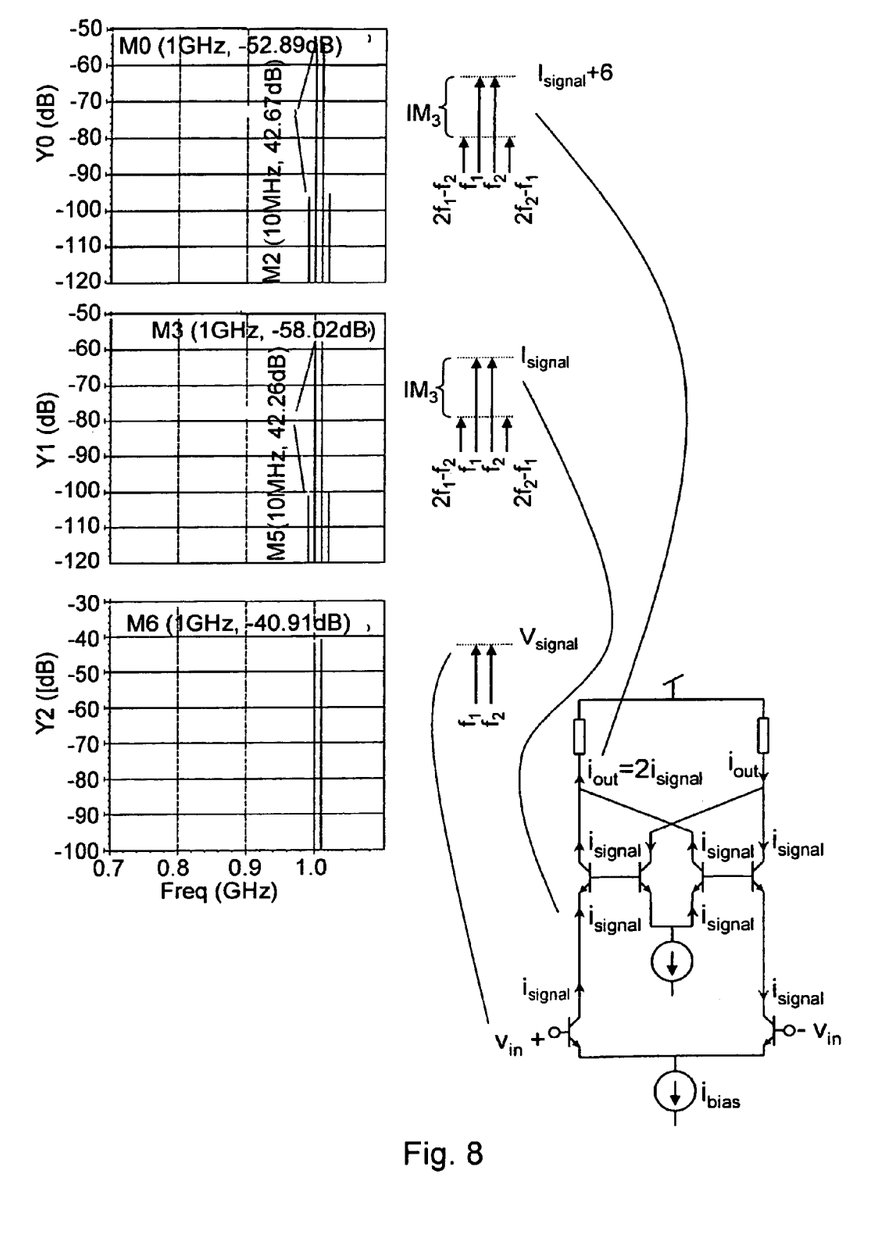

Studying the simulation results in FIG. 8, where the amplifier circuit according to the embodiment from FIG. 3 is shown, we notice that the input signal level has been amplified from −40.91 dB to −58.04 dB (in absolute terms) by the transconductance stage. The middle diagram shows that the difference between the useful signal and the intermodulation products is 42.26 dB. However, analyzing the uppermost amplification diagram in FIG. 8 it is apparent that the difference between the useful signal and the intermodulation products is somewhat higher than in the case of the cascode amplifier. At the same time, the output current from the amplification circuit according to the embodiment in FIG. 3 is doubled. Remembering $IM_3=2(IP_3-I_{signal})$ this means an increase in linearity of 6 dB.

Figure 9:
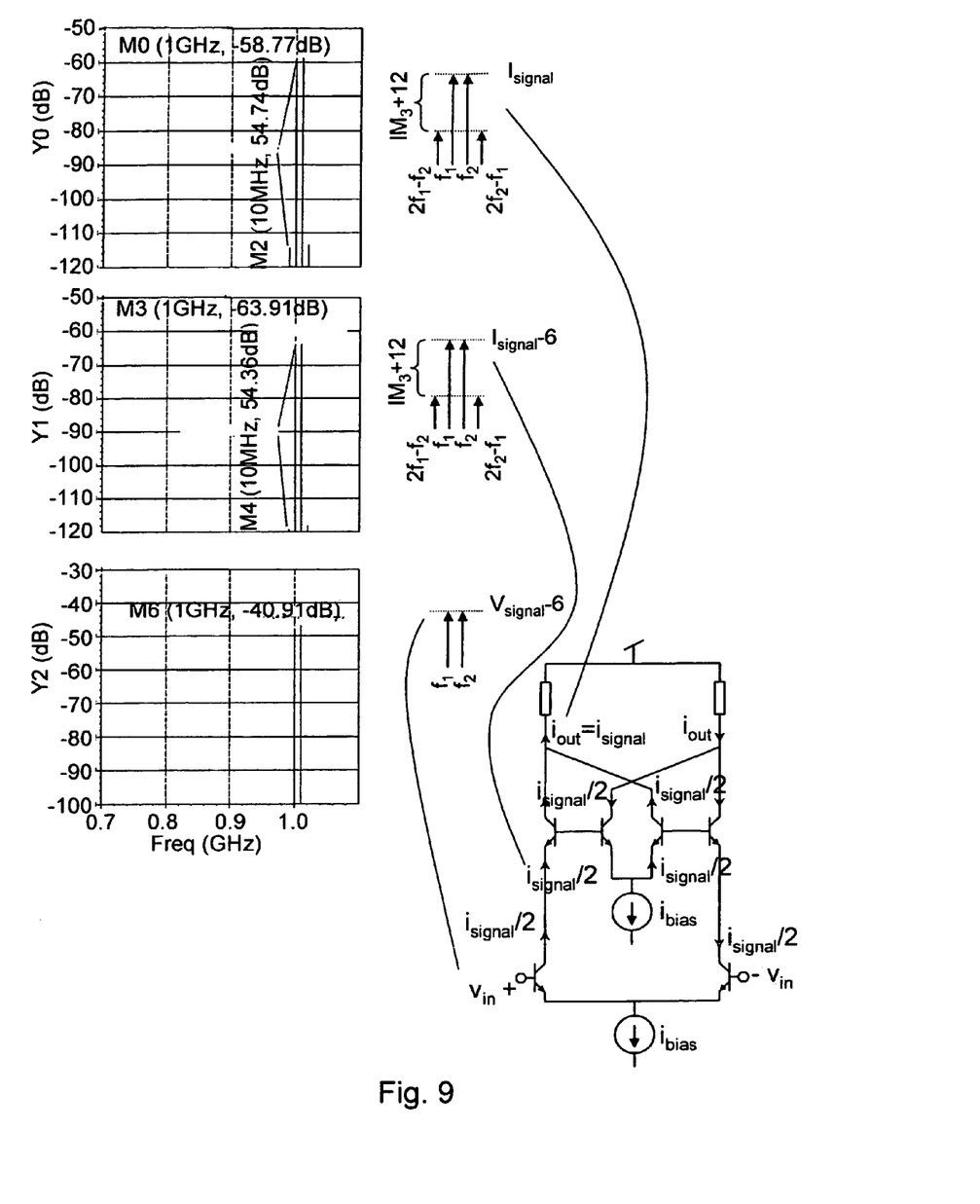

FIG. 9 illustrates a situation where the same embodiment as in FIG. 3 is used, but where the signal current out from the transconductance stage has been reduced by half. The output current from the circuit in FIG. 9 is thus also reduced by half meaning that the amplification circuit has essentially the same output current as the cascode amplifier in FIG. 1.

However, the reduction of the current after the transconductance stage leads to an important effect.

As can be seen from the amplification diagrams on the left side of FIG. 9, the reduction of the current out from the transconductance stage results in a considerable suppression of intermodulation products and thus increased linearity of the amplifier circuit from FIG. 3. From the middle diagram it is evident that the difference between the useful signal and the intermodulation products has increased to 54.36 dB, thus an improvement by 12.16 dB. Analyzing the uppermost diagram in FIG. 9 it can be seen that the useful signals has the same amplitude as in FIG. 7 while the intermodulation products are reduced by 12 dB.

As will be apparent to the skilled person having studied the above circuit solutions for the modified cascode amplifier, other circuit solutions besides the common-base balun for the modified cascode circuit in FIG. 3 may be possible.

Ultimately, the present invention is only limited by the scope of the accompanying patent claims.

The invention claimed is:

1. An amplifier circuit for current amplification, comprising:
   an input stage adapted to receive an input signal;
   at least one current multiplication stage connected to the input stage, the current multiplication stage being adapted to receive a current signal from the input stage and produce a multiplied output current signal at an output of the amplifier circuit, wherein the current multiplication stage comprises at least two current multiplication circuits connected to each other, each current multiplication circuit being adapted to produce an output current signal essentially equal to the current signal from the input stage, such that the output current signal at an output of the amplifier circuit comprises a sum of the current signals received at each current multiplication circuit, and wherein the at least two current multiplication circuits, each comprising a first and a second transistor having their base terminals connected to each other, the first transistor adapted to receive an input signal current at its emitter terminal and to output an output current essentially identical but with reversed polarity to the input signal current on the collector terminal of the first transistor and the emitter terminal of the second transistor, the current multiplication circuit adapted to fulfil a function of the current multiplication stage in the amplifier circuit.

2. The amplifier circuit according to claim 1, wherein the current amplification stage comprises a bias current.

3. The amplifier circuit according to claim 1, wherein the input stage comprises a voltage conversion stage adapted to convert an input voltage signal into the current signal.

4. The amplifier circuit according to claim 3, further comprising:
   a modified cascode amplifier, such that the voltage conversion stage corresponds to a transconductance amplification stage of a cascode amplifier, while the current multiplication stage has replaced a current follower stage of the cascode amplifier.

5. The amplifier circuit according to claim 4, wherein the emitter terminals of the transistors of the voltage conversion stage are connected so as to share a common bias current and adapted to receive an input voltage signal over their base terminals and to convert the input voltage signal into a signal current, the multiplication stage comprising a first common-base balun in the current multiplication stage adapted to receive the signal current at an emitter terminal of one of its transistors and to reproduce essentially the same signal current with different polarity at a collector of another one of its transistors, the current multiplication stage further comprising a second common-base balun adapted to receive a signal current from the transconductance amplification stage at an emitter terminal of one of its transistors and to reproduce the current signal with opposite polarity at a collector terminal of another one of its transistors, the first and second common-base baluns being cross-coupled such that the output current signals produced at the collector terminals of the one of the transistors and the other of the transistors as well as the collector terminals of the one of the transistors and the other of the transistors are combined such as to produce an output signal current essentially equal to double the signal current produced by the transconductance amplification stage.

6. The amplifier circuit according to claim 4, further comprising:
an emitter follower connected to the voltage conversion stage of the amplifier circuit adapted to feed the amplifier circuit.

7. The amplifier circuit according to claim 6, wherein the emitter follower is connected to the current multiplication stage.

8. The amplifier circuit according to claim 7, wherein the emitter follower is connected to the current multiplication stage, so to use the bias current of the current multiplication stage.

9. The amplifier circuit according to claim 1, wherein the current multiplication stage comprises three current multiplication circuits connected to each other, where each current multiplication circuit is adapted to produce an output current signal essentially equal to the current signal from the input stage of the amplifier circuit, such that the output current at the output of the amplifier circuit comprises essentially three times the current signal from the input stage.

10. The amplifier circuit according to claim 1, wherein the input stage of the amplifier circuit is adapted to receive a current signal and wherein the at least two current multiplication circuits of the current multiplication stage are adapted to produce an output current at the output of the amplifier circuit, the output current being at least twice the current signal from the input stage.

11. The amplifier circuit according to claim 1, wherein the current multiplication stage is adapted to deliver N times the output current from the input stage at the output of the amplifier circuit, N being an integer and corresponding to the number of current multiplication circuits connected together in the current multiplication stage.

12. The amplifier circuit according to claim 1, wherein the at least two current multiplication circuits of the current multiplication stage are cross-coupled with each other.

13. The amplifier circuit according to claim 4, wherein the voltage conversion stage and the current multiplication stage comprise biased semiconductor components in the form of transistors.

14. The amplifier circuit according to claim 13, wherein the transistors comprise one of bipolar transistors or field-effect transistors.

15. A current multiplication circuit, comprising:
a first and a second transistor having their base terminals connected to each other, the first transistor adapted to receive an input signal current at its emitter terminal and to output an output current essentially identical but with reversed polarity to the input signal current on the collector terminal of the first transistor and the emitter terminal of the second transistor, the current multiplication circuit adapted to fulfil a function of a current multiplication stage in an amplifier circuit comprising an input stage adapted to receive an input signal, and at least one current multiplication stage connected to the input stage, the current multiplication stage being adapted to receive a current signal from the input stage and produce a multiplied output current signal at an output of the amplifier circuit, wherein the current multiplication stage comprises at least two current multiplication circuits connected to each other, each current multiplication circuit being adapted to produce an output current signal essentially equal to the current signal from the input stage, such that the output current signal at an output of the amplifier circuit comprises a sum of the current signals received at each current multiplication circuit, and wherein the at least two current multiplication circuits, each comprising a first and a second transistor having their base terminals connected to each other, the first transistor adapted to receive an input signal current at its emitter terminal and to output an output current essentially identical but with reversed polarity to the input signal current on the collector terminal of the first transistor and the emitter terminal of the second transistor, the current multiplication circuit adapted to fulfil a function of the current multiplication stage in the amplifier circuit.

16. A method for increasing linearity in an amplifier circuit, the method comprising:
receiving a signal at an input stage of an amplifier circuit;
receiving a signal current from the input stage at a current amplification stage;
producing essentially the same signal current at the outputs of at least two current amplification circuits of the current amplification stage; and
combining the signal currents at the outputs of the at least two current amplification circuits to produce a sum of the signal currents at the output of the amplifier circuit, wherein the at least two current amplification circuits are multiplication circuits, each comprising a first and a second transistor having their base terminals connected to each other, the first transistor being adapted to receive an input signal current at its emitter terminal and to output an output current essentially identical but with reversed polarity to the input signal current on the collector terminal of the first transistor and the emitter terminal of the second transistor, the current multiplication circuit being adapted to fulfil a function of a current multiplication stage in the amplifier circuit.

* * * * *